(12) United States Patent
Ohsawa et al.

(10) Patent No.: US 7,190,448 B2
(45) Date of Patent: Mar. 13, 2007

(54) SURFACE INSPECTING APPARATUS

(75) Inventors: Kouji Ohsawa, Aichi (JP); Tatsushi Takahashi, Aichi (JP); Katsuhiro Natsume, Aichi (JP); Takahiro Miura, Aichi (JP)

(73) Assignee: Nidek Co., Ltd., Aichi (JP)

( * ) Notice: Subject to any disclaimer, the term of this patent is extended or adjusted under 35 U.S.C. 154(b) by 408 days.

(21) Appl. No.: 10/693,695

(22) Filed: Oct. 27, 2003

(65) Prior Publication Data
US 2004/0160609 A1  Aug. 19, 2004

(30) Foreign Application Priority Data
Oct. 25, 2002   (JP)   ............ P2002-310962

(51) Int. Cl.
*G01N 21/01*   (2006.01)
(52) U.S. Cl. .................................... 356/244
(58) Field of Classification Search ................ 356/244, 356/246, 237.1–237.5, 394, 512, 450, 521; 279/106; 269/20; 118/500, 503, 728, 730
See application file for complete search history.

(56) References Cited

U.S. PATENT DOCUMENTS

| 4,684,021 A | * | 8/1987 | Niebling et al. | ............ 206/711 |
| 5,511,005 A | * | 4/1996 | Abbe et al. | .................... 702/84 |
| 6,242,926 B1 | * | 6/2001 | Gardopee et al. | ............ 324/661 |
| 6,606,154 B1 | * | 8/2003 | Oda | ............................ 356/244 |
| 6,844,929 B2 | * | 1/2005 | Glenn et al. | ................. 356/244 |

FOREIGN PATENT DOCUMENTS

| JP | 02-087006 A | 3/1990 |
| JP | 10-062136 A | 3/1998 |
| JP | 10-221033 A | 8/1998 |

* cited by examiner

*Primary Examiner*—Hwa (Andrew) Lee
(74) *Attorney, Agent, or Firm*—Sughrue Mion, PLLC

(57) ABSTRACT

A surface inspection apparatus for inspecting a shape of an inspected surface of an object to be inspected includes: a supporting unit capable of supporting the object in a state in which the inspected surface is in a substantially vertical state; and a moving state which moves the object in a substantially vertical direction while the inspected surface is maintained in the substantially vertical state.

3 Claims, 5 Drawing Sheets

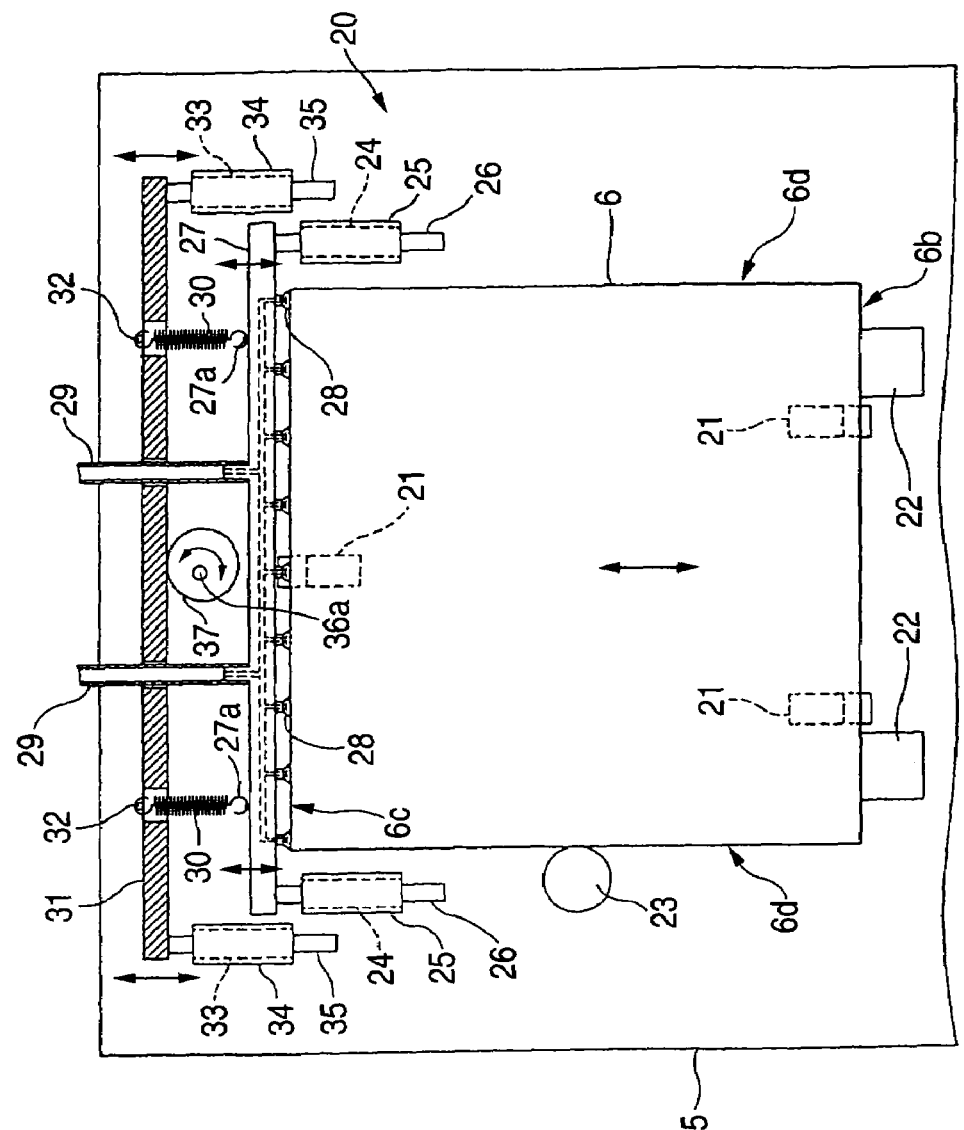

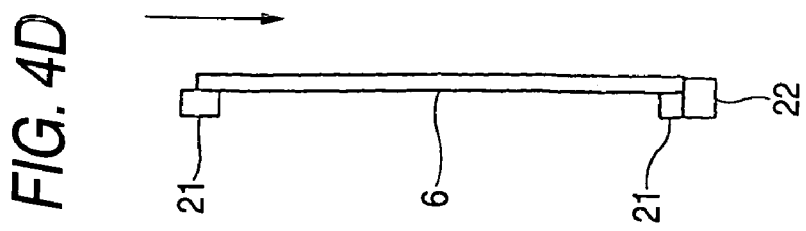
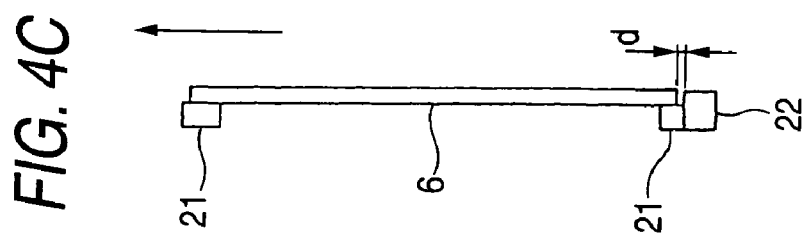
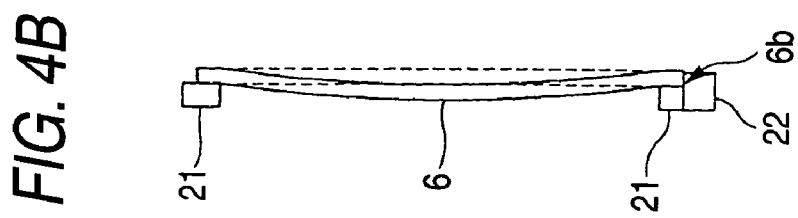
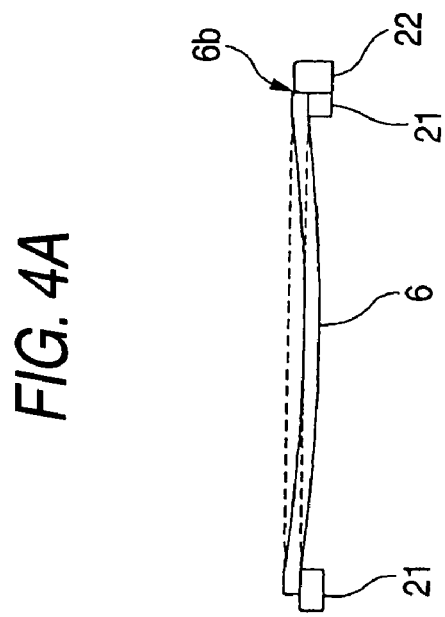

SURFACE INSPECTING APPARATUS

BACKGROUND OF THE INVENTION

The present invention relates to a surface inspecting apparatus for inspecting the shape of the surface of an object to be inspected.

In a semiconductor manufacturing process, when a wafer coated with a photosensitive agent is to be exposed, a glass mask plate on which an IC circuit pattern is drawn is put to be adapted to the wafer and ultraviolet rays irradiates by an exposing device to transfer the circuit pattern onto the wafer. The circuit pattern drawn on the glass mask plate is reduced and projected onto the wafer. Therefore, a high flatness is required for the glass mask plate.

When the shape of the surface (the flatness of the surface) of the glass mask plate is to be inspected, there are the cases in which the glass mask plate is supported horizontally and in which the glass mask plate is supported vertically (including the case in which the glass mask plate is not supported perfect vertically). In the vertical support, an inspection with higher precision than that in the horizontal support can be carried out in the view point that the glass mask plate is deformed by its own weight with more difficulty than in the horizontal support.

In the conventional vertical support, however, since the glass mask plate is changed to be set from a horizontal supporting state into a vertical supporting state, the shape of a surface cannot be inspected with high precision by the influence of a deformation caused by its own weight in the horizontal supporting state or the influence of a deformation caused by a concentrated load on a support portion.

SUMMARY OF THE INVENTION

In consideration of the problems of the conventional art, it is a technical object of the invention to provide a surface inspecting apparatus capable of inspecting the shape of a surface with high precision.

In order to solve the aforesaid object, the invention is characterized by having the following arrangement.

(1) A surface inspecting apparatus for inspecting a shape of a surface to be inspected of an object to be inspected comprising:
a supporting unit capable of supporting the object in a state in which the surface is in a substantially vertical state; and
a moving unit which moves the object in a substantially vertical direction while the inspected surface is maintained in the substantially vertical state.

(2) The surface inspecting apparatus according to (1), wherein the supporting unit includes a supporting member which supports a lower end of the object in the state in which the surface is in the substantially vertical state, and
wherein the moving unit lifts the object until the lower end of the object is separated from the supporting member and thereafter lowers the object until the lower end of the object abuts on the supporting member.

(3) The surface inspecting apparatus according to (2), wherein the supporting member has an elastic member provided at a portion where the lower end of the object abuts.

(4) The surface inspecting apparatus according to (1), wherein the moving unit suspends the object by holding at least one of an upper portion and a side portion of the object.

(5) The surface inspecting apparatus according to (4), wherein the moving unit adjusts suspending force in accordance with gravity of the object.

(6) The surface inspecting apparatus according to (5), wherein the moving unit suspends the object with substantially half of the gravity of the object.

(7) The surface inspecting apparatus according to (1), wherein the supporting unit is capable of supporting the object in a state in which the surface is inclined with respect to the vertical direction by 0 to 4 degrees.

(8) A surface inspecting apparatus for inspecting a shape of a surface to be inspected of an object to be inspected comprising:
a supporting unit capable of supporting the object in a state in which the inspected surface is in a substantially vertical state; and
a suspending unit which suspends the object while the inspected surface is maintained in the substantially vertical state.

(9) The surface inspecting apparatus according to (8), wherein the suspending unit adjusts suspending force in accordance with gravity of the object.

(10) The surface inspecting apparatus according to (9), wherein the suspending unit suspends the object with substantially half of the gravity of the object.

BRIEF DESCRIPTION OF THE DRAWINGS

FIGS. 2A and 2B are views showing a support unit mechanism, FIGS. 4A through 4D are views showing states in which the glass plate to be inspected is mounted.

DETAILED DESCRIPTION OF PREFERRED EMBODIMENTS

Figure 1:
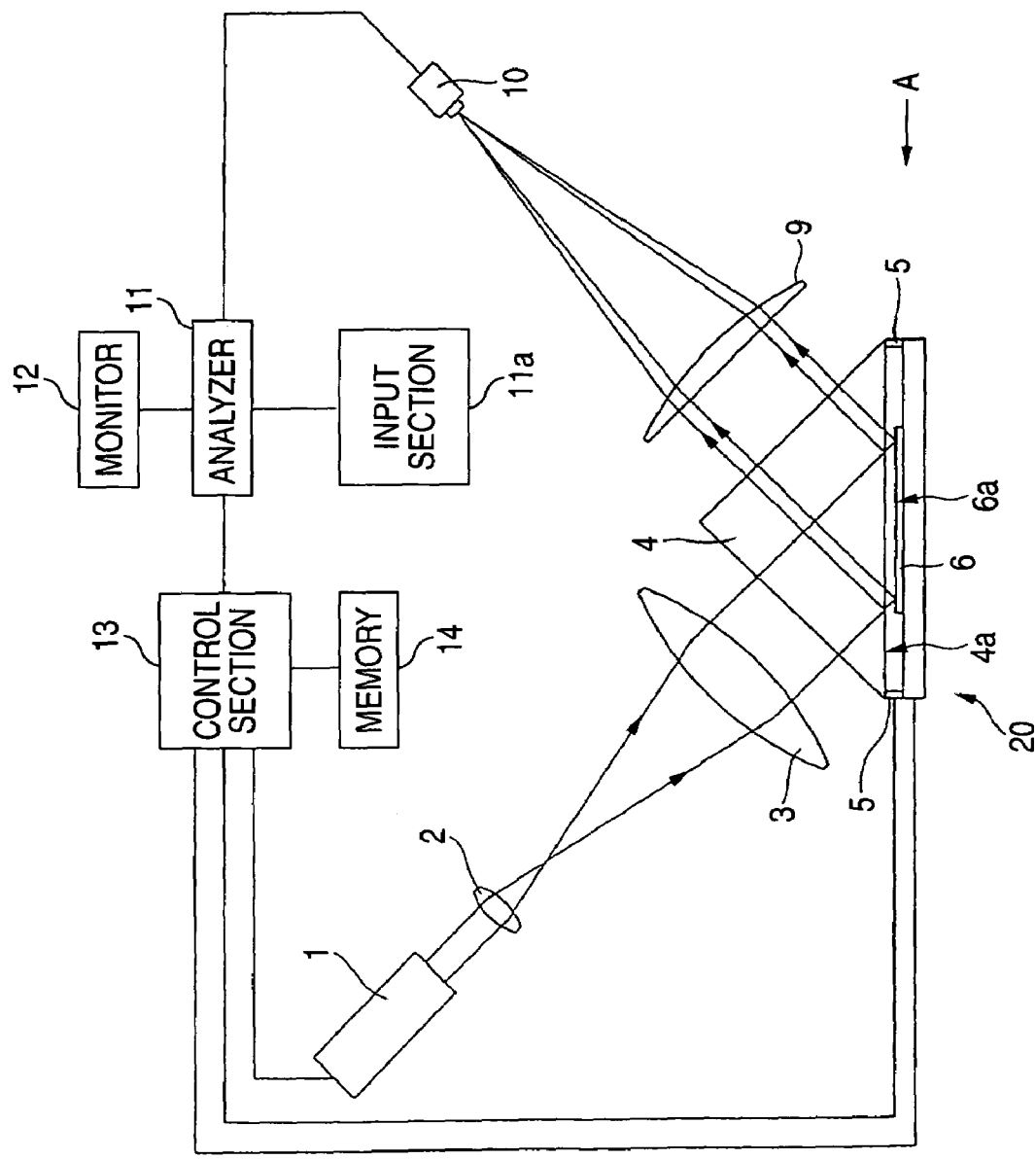
FIG. 1 is a view showing the schematic structure of the main parts of an inspecting optical system and a control system in a surface inspecting apparatus.

An embodiment according to the invention will be described below with reference to the drawings. FIG. 1 is a view showing the schematic structure of the main parts of an inspecting optical system and a control system in a surface inspecting apparatus according to the invention. An oblique incidence interferometer is illustrated. In the inspecting optical system in FIG. 1, a schematic structure seen from above is shown. A laser beam for an inspection which is emitted from an He—Ne laser beam source 1 as an inspecting light source passes through an expander lens 2 and is then changed into a parallel luminous flux by a collimator lens 3 and the parallel luminous flux is thereafter incident on a prism 4. A part of the laser beam incident on the prism 4 is transmitted through a reference plane 4a and is reflected by a plane 6a to be inspected in a glass plate 6 to be inspected which is supported on a support unit 20, and passes through the prism 4 again and is transmitted through a lens 9 toward a camera 10. Further, another part of the laser beam incident on the prism 4 is reflected by the reference plane 4a and passes through the lens 9 toward the camera 10. The camera 10 picks up the image of an interference fringe formed by a laser beam reflected by the plane 6a and a laser beam reflected by the reference plane 4a. The image of the interference fringe thus picked up is input as a video signal to an analyzer 11. The analyzer 11 carries out an arithmetic analysis for the shape of a surface based on the input signal.

Incidentally, an input section 11a such as a keyboard, a mouse, an inspection start switch and the like, a monitor 12 for displaying the picked-up image and a result of the analysis and a control section 13 are connected to the analyzer 11. The control section 13 controls the driving operations of the laser beam source 1, the motor of the support unit 20, a piezo unit 5 and the like. The prism 4 is moved by the piezo unit 5 to change a distance between the reference plane 4a and the plane 6a so that the phase of a reference beam is varied. Moreover, a memory 14 is connected to the control section 13.

Next, the support unit 20 will be described. The glass plate 6 is put in a horizontal state shown in FIG. 3A and is then put in a substantially (almost) vertical state shown in FIG. 3B by the rotating movement of the support unit 20. FIGS. 2A and 2B show the substantially vertical state shown in FIG. 3B. FIG. 2A is a side view showing the support unit 20 and FIG. 2B is a view showing the side view of FIG. 2A seen in a direction of an arrow B.

The support unit 20 is provided on a mounting table 15. Three mounting tables 21 for mounting the glass plate 6 are fixed onto the mounting table 15. Each of the mounting tables 21 is provided to abut on an outer peripheral portion (for example, a portion provided on an inside by 2 mm from an edge) on the back side where the mask pattern of the glass plate 6 is not formed. Moreover, two guides 22 for a lower end which serve to position the glass plate 6 and one guide 23 for a side end are fixed onto the mounting table 15. When the glass plate 6 is erected substantially vertically, a lower end (a lower surface) 6b abuts on the guide 22, thereby supporting the glass plate 6.

Moreover, two ball bushes 24 to be translation guides are fixed onto the mounting table 15 by means of an attachment block 25. Shafts 26 are slidably inserted through the ball bushes 24, respectively. The ends of the shafts 26 are fixed to a suction support base 27. Nine suction cups 28 for holding (supporting) an upper end (an upper surface) 6c of the glass plate 6 are attached to the suction support base 27. Evacuating piping is formed in each of the suction cups 28 and the suction support base 27 as shown in a broken line of FIG. 2B. Moreover, a hose 29 coupled to a vacuum source or a vacuum pump which is not shown is attached to the upper part of the suction support base 27. The driving operation of the vacuum source or the vacuum pump is controlled by the control section 13.

One of the ends of each tension spring 30 is hung on a hook 27a provided on the upper part of the suction support base 27, and the other end of each spring 30 is fixed to a moving support base 31 with a pin 32. Shafts 35 are fixed to the moving support base 31, respectively. The shafts 35 are slidably inserted through ball bushes 33, respectively, and the ball bushes 33 are fixed onto the mounting table 15 by means of an attachment block 34.

Moreover, a motor 36 is attached to the mounting table 15 and an eccentric cam 37 is fixed to a shaft 36a of the motor 36. The cam 37 abuts on the bottom surface of the moving support base 31 and the moving support base 31 is vertically moved by the rotation of the cam 37. 38 denotes an encoder attached to the motor 36. The motor 36 and the encoder 38 are connected to the control section 13 and the driving operation of the motor 36 is controlled by the control section 13.

Incidentally, the support unit 20 is erected to be slightly inclined in a vertical direction as shown in FIG. 2A in such a manner that the glass plate 6 does not fall down during an inspection. It is preferable that the inclination angle should be 0 to 4 degrees in the vertical direction. In the embodiment, the inclination angle is set to be 2 degrees in the vertical direction.

Figure 3B:
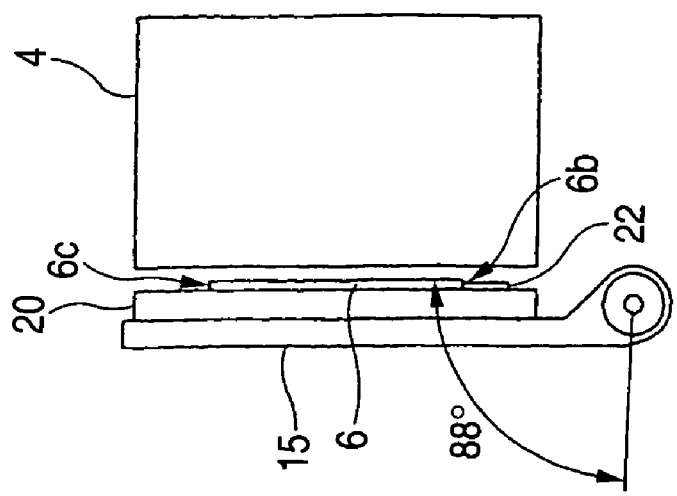
FIGS. 3A and 3B are views showing a state in which the glass plate to be inspected is mounted.
Figure 3A:
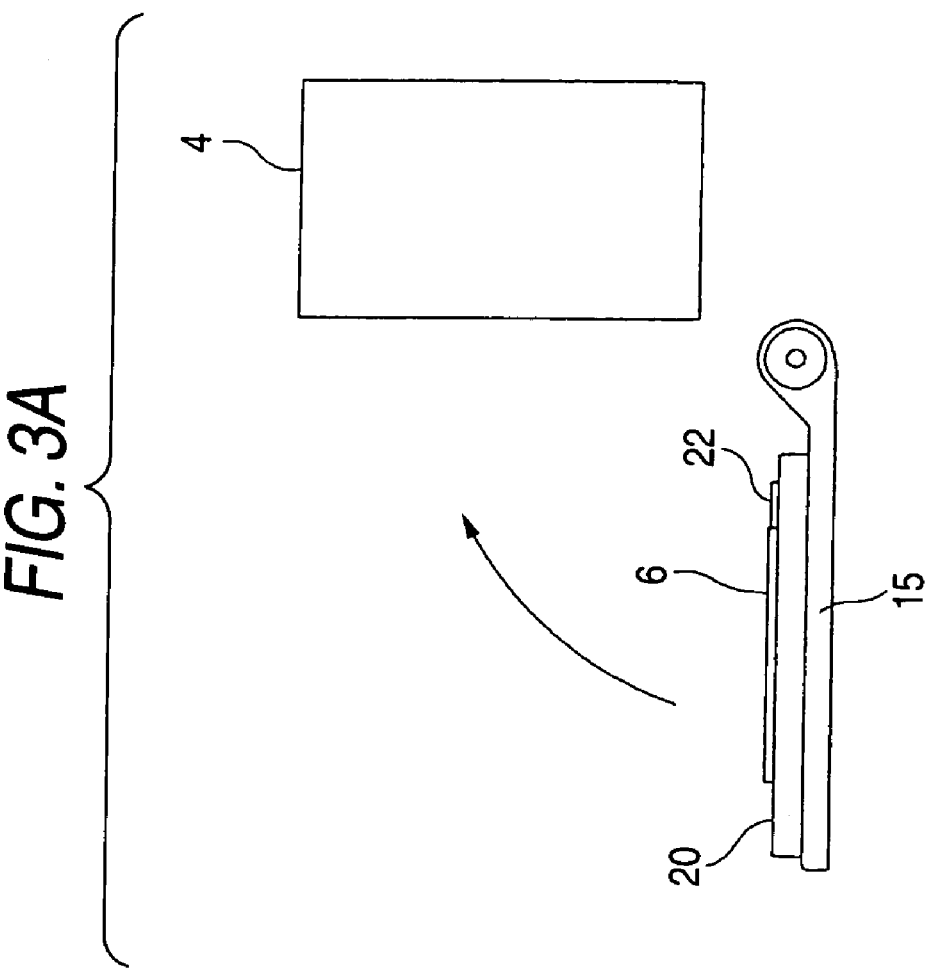

In the surface inspecting apparatus having the structure described above, the operation will be described below. First of all, in a state shown in FIG. 3A, the glass plate 6 is horizontally put on the mounting table 21 of the support unit 20. Then, the lower end 6b and a side end 6d of the glass plate 6 are pressed against the guides 22 and the guide 23 to carry out positioning, respectively. Next, the mounting table 15 is rotated and moved to bring the glass plate 6 into a substantially vertical state as shown in FIG. 3B (in the embodiment, the glass plate 6 is inclined at 88 degrees in a horizontal direction).

When the setting of the glass plate 6 is completed and the inspection start switch of the input section 11a is pushed, the control section 13 opens a solenoid valve (not shown) connected to the vacuum source or the vacuum pump. Moreover, the control section 13 drives the motor 36, thereby rotating the cam 37 and bringing the moving support base 31 to a lowermost position (the position of the moving support base 31 is detected by obtaining the rotating angle of the cam 37 through the encoder 38). When the moving support base 31 is moved downward to the lowermost position, the suction support base 27 is also moved downward to the lowermost position and the upper end 6c of the glass plate 6 is sucked by the suction cups 28. When the glass plate 6 is sucked, the control section 13 drives the motor 36, thereby rotating the cam 37 and lifting the moving support base 31. When the moving support base 31 is lifted, the suction support base 27 and the glass plate 6 are lifted through the springs 30. The lower end 6b of the glass plate 6 is lifted until it is separated from the guide 22. Then, the control section 13 drives the motor 36 to reversely rotate the cam 37 so that the lower end 6b of the glass plate 6 starts to abut on the guide 22, and is moved downward to be suspended by the substantially half force of the gravity (weight) of the glass plate 6 and is then stopped.

By thus suspending the glass plate 6, a load received by the lower end 6b of the glass plate 6 in the vertical support is relieved and a deformation such as a flexure or a warpage by the dead weight of the glass plate 6 is suppressed. It is preferable that the force for suspending the glass plate 6 should be the substantially half force of the gravity of the glass plate 6 in order to cause a load applied in a vertical direction to be uniform. Also in a state in which the glass plate 6 is completely suspended, the deformation caused by the dead weight of the glass plate 6 can be more suppressed than that in the vertical support according to the conventional art.

The spring constant, initial tension and length of the spring 30 and the amount of movement of the moving support base 31 by the rotation of the cam 37 are designed to satisfy the operating conditions. On the operating conditions, the glass plate 6 can be sucked when the moving support base 31 is set in the lowermost position by the rotation of the cam 37, the lower end 6b of the glass plate 6 is separated from the guide 22 when the moving support base 31 is lifted by the rotation of the cam 37, and the suspension can be carried out by substantially the half force of the gravity of the glass plate 6 when the lower end 6b is moved downward therefrom. The lowermost position of the moving support base 31, a position in which the glass plate 6 is lifted and separated from the guide 22 and a position in which the suspension is carried out by substantially the half force of the gravity of the glass plate 6 are prestored as the signal of the encoder 38 in the memory 14, and the control section 13 drives the motor 36 in response to a signal sent from the encoder 38. The weight of the glass plate 6 is previously given.

With reference to FIG. 4, description will be given to advantages produced by lifting the glass plate 6 and once separating the glass plate 6 from the guide 22, and bringing down and suspending the glass plate 6 by substantially the half force of the gravity of the glass plate 6. In a state in which the glass plate 6 is put horizontally, a central part thereof is warped by its own weight over the mounting table 21 as shown in FIG. 4A. Even if the glass plate 6 is erected vertically in this state as shown in FIG. 4B, the warpage remains in order of nanometer. In a rotating process from a horizontal condition to a vertical condition (a process shown in FIGS. 4A and 4B), moreover, the lower end 6b of the glass plate 6 is rubbed with the guide 22 so that scuffing is caused to bring a state in which the glass plate 6 is warped. In order to remove the internal residual stress of the glass plate 6, therefore, the glass plate 6 is suspended and separated until a clearance d is formed between the glass plate 6 and the guide 22 as shown in FIG. 4C. The clearance d has an optional value of d>0, and the clearance d preferably has a smaller value because a useless motion and a wasteful time are more lessened, which is efficient. In a state in which the glass plate 6 is erected vertically, moreover, the glass 6 is deformed due to buckling caused by its own weight or a concentrated load on the guide 22. In order to relieve the influence, the glass plate 6 is slightly brought downward in the state of FIG. 4C as shown in FIG. 4D and is suspended by substantially the half force of the gravity thereof. In this state, the surface of the glass plate 6 is inspected. Consequently, the inspection can be carried out in a state in which the deformation is less caused than that in a conventional method.

Figure 5:
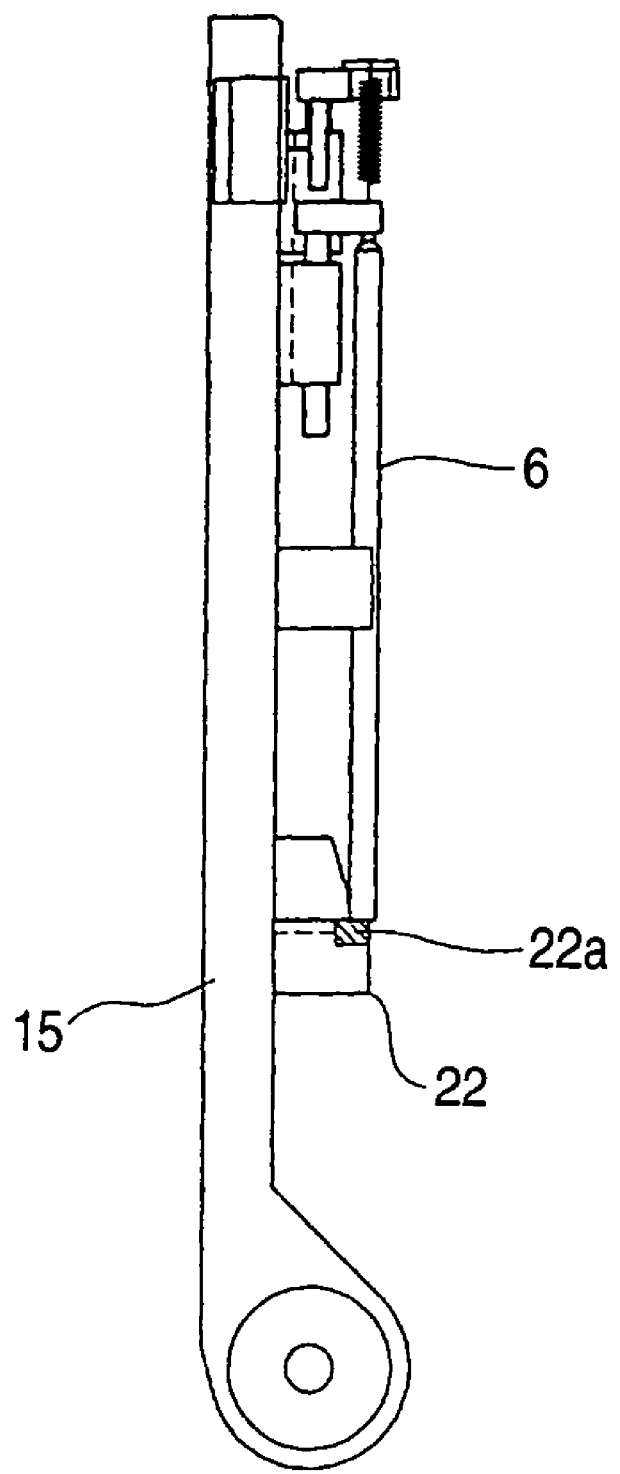
FIG. 5 is a view showing a variant of a support unit.

Even if the suspension is carried out by substantially the half force of the gravity of the glass plate 6, an substantially half of the gravity of the glass plate 6 is applied to a portion in which the lower end 6b of the glass plate 6 abuts on the guide 22. In order to relieve a concentrated load in the abutment portion on the guide 22, therefore, an elastic member 22a such as urethane rubber or silicone rubber may be attached to the upper part of the guide 22 as shown in FIG. 5.

After the glass plate 6 is suspended as described above, a laser beam is emitted from the laser beam source 1 so that the images of interference fringes formed by the laser beams reflected by the reference plane 4a and the plane 6a are picked up by the camera 10. Moreover, the control section 13 applies a voltage to the piezo unit 5 to change a distance between the reference plane 4a and the plane 6a, thereby varying the phase of the interference fringe. The image of the interference fringe having the phase thus changed is picked up by the camera 10 and each image data are fetched into a memory in the analyzer 11.

The analyzer 11 carries out a well-known processing such as noise removal over a plurality of interference fringe images having different phases which are fetched into the memory. By converting phase data into height data, the three-dimensional shape of the surface of the plane 6a is obtained. The three-dimensional shape thus obtained is displayed on the monitor 12 in a bird's-eye view or a contour map. Consequently, the flatness of the plane 6a can be evaluated.

While the glass plate 6 is suspended to form a vertical moving mechanism in the embodiment, the lower end 6b of the glass plate 6 may be pressed to form a vertical moving mechanism.

While the mechanism for suspending the glass plate 6 is mainly constituted by the spring 30, the motor 36 and the cam 37, moreover, it is not restricted but any mechanism capable of regulating force for suspending the glass plate 6 corresponding to the weight of the glass plate 6 may be used. For example, it is also possible to employ a mechanism for vertically moving the suction support base 27 by means of an air cylinder and regulating suspension force by a pressure applied to the air cylinder. Moreover, a load cell such as a piezoelectric unit may be incorporated in a member for suspending the glass plate 6 and a load may be measured by the load cell to regulate the suspension force.

While the mechanism for suspending the glass plate 6 sucks and supports the upper end 6c of the glass plate 6, moreover, the left and right side ends 6d of the glass plate 6 may be sucked and supported in both directions. As a method of supporting the upper end 6c and the side end 6d in the glass plate 6, furthermore, it is also possible to use an adhesive capable of being peeled through pull by certain greater force than a gravity load in addition to the suction.

Further, although, in the above embodiment, the glass plate is used as the object to be inspected, the invention is not limited thereto and can be applied to the which may be deformed due to its own weight. Moreover, the inspecting method is not limited to the above described method and know method is applicable.

As described above, according to the invention, the deformation of an object to be inspected can be suppressed and the shape of a surface can be inspected with high precision.

What is claimed is:

1. A surface inspecting apparatus for inspecting at least one of a shape and a flatness of a surface of a thin-plate-shaped object to be inspected, the apparatus comprising:
    a suspending unit which suspends the object substantially vertically with respect to a horizontal plane and moves the suspended object upwardly and downwardly as the object is in a substantially vertical state; and
    a supporting member on which a lower end of the suspended object abuts and which supports the suspended object as the object is in the substantially vertical state; and
    a control unit which controls the suspending unit to suspend the object by substantially half the force of gravity of the object.

2. The surface inspecting apparatus according to claim 1, wherein the control unit controls the suspending unit to move the suspended object upwardly until the lower end of the suspended object is separated from the supporting member and thereafter moves the suspended object downwardly until the lower end of the suspended object abuts on the supporting member again.

3. The surface inspecting apparatus according to claim 1, wherein the supporting member has an elastic member provided at a portion where the lower end of the suspended object abuts.

* * * * *